(12) United States Patent
Takano et al.

(10) Patent No.: US 7,622,684 B2
(45) Date of Patent: Nov. 24, 2009

(54) ELECTRONIC COMPONENT PACKAGE

(75) Inventors: Atsushi Takano, Osaka (JP); Mitsuhiro Furukawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 11/719,160

(22) PCT Filed: Oct. 30, 2006

(86) PCT No.: PCT/JP2006/321639

§ 371 (c)(1),
(2), (4) Date: May 11, 2007

(87) PCT Pub. No.: WO2007/052598

PCT Pub. Date: May 10, 2007

(65) Prior Publication Data

US 2009/0071711 A1    Mar. 19, 2009

(30) Foreign Application Priority Data

Nov. 2, 2005    (JP) ............................. 2005-319057
Dec. 19, 2005    (JP) ............................. 2005-364598

(51) Int. Cl.
*H01L 23/48* (2006.01)
*H01L 23/28* (2006.01)
(52) U.S. Cl. .................. 174/527; 174/521; 257/787
(58) Field of Classification Search .............. 174/521, 174/527, 549, 560; 257/416, 787
See application file for complete search history.

(56) References Cited

U.S. PATENT DOCUMENTS

| | | | | |
|---|---|---|---|---|
| 5,798,557 A | * | 8/1998 | Salatino et al. | 257/416 |
| 5,915,168 A | * | 6/1999 | Salatino et al. | 438/110 |
| 5,918,112 A | * | 6/1999 | Shah et al. | 438/107 |
| 6,448,635 B1 | * | 9/2002 | Glenn | 257/676 |
| 6,504,096 B2 | * | 1/2003 | Okubora | 174/521 |
| 6,649,446 B1 | * | 11/2003 | Goetz et al. | 438/110 |
| 7,042,056 B2 | * | 5/2006 | Koshido | 257/414 |
| 7,129,576 B2 | * | 10/2006 | Humpston | 257/704 |
| 7,231,712 B2 | * | 6/2007 | Saito et al. | 29/855 |
| 2002/0074146 A1 | * | 6/2002 | Okubora | 174/521 |
| 2005/0067177 A1 | * | 3/2005 | Saito et al. | 174/521 |

FOREIGN PATENT DOCUMENTS

| | | | |
|---|---|---|---|
| JP | 2000-261284 | * | 9/2000 |
| JP | 2001-244785 | * | 9/2001 |

(Continued)

OTHER PUBLICATIONS

International Search Report (PCT/JP2006/321639) dated Jan. 23, 2007.

*Primary Examiner*—Hung V Ngo
(74) *Attorney, Agent, or Firm*—Pearne & Gordon LLP

(57) ABSTRACT

An electronic component package comprises: an electronic component where device elements are mounted inside cavities formed between a component substrate and a component cover that covers the component substrate; and a mounting substrate. The component cover is placed on the mounting substrate, and the electronic component is mounted on the mounting substrate and molded by a resin. At least one of a ground electrode and a dummy electrode is provided on a surface of the component cover, the surface being placed on the mounting substrate. At least one of the ground electrode and the dummy electrode is provided in a position opposed to at least part of the cavities.

16 Claims, 12 Drawing Sheets

FOREIGN PATENT DOCUMENTS

| | | | |
|---|---|---|---|
| JP | 2002-198744 | * | 7/2002 |
| JP | 2002-198774 | | 7/2002 |
| JP | 2002-217673 | * | 8/2002 |
| JP | 2003-110391 | | 4/2003 |
| JP | 2004-110391 | * | 4/2003 |
| JP | 2004-129222 | * | 4/2004 |
| JP | 2005-285864 | * | 10/2005 |

* cited by examiner

PRIOR ART

US 7,622,684 B2

ELECTRONIC COMPONENT PACKAGE

This application is a U.S. National Phase Application of PCT International Application PCT/JP2006/321639.

TECHNICAL FIELD

The present invention relates to an electronic component package.

BACKGROUND ART

FIG. 19 shows a package of a surface acoustic wave (hereinafter referred to as SAW) device as one example of conventional electronic component packages. In FIG. 19, this package comprises: component substrate 1101; interdigital transducer electrodes (hereinafter referred to as IDT electrodes) 1102; component cover 1104 having a cavity 1103 in a portion opposed to IDT electrodes 1102; and external electrode 1106 that joins component cover 1104 and mounting substrate 1105.

It is to be noted that as prior art document information associated with the invention of this application, Japanese Patent Unexamined Publication No. 2003-110391 and Japanese Patent Unexamined Publication No. 2001-244785 are known.

However, the conventional electronic component package has the problem of being unable to withstand pressure and shock. Namely, since cavity 1103 is provided in component cover 1104 for the purpose of preventing component cover 1104 and a plurality of IDT electrodes 1102 from coming into contact with each together, the portion of component cover 1104 where cavity 1103 is present is very thin. Therefore, in a case where this SAW device is mounted on mounting substrate 1105 and then coated by a mold resin, component cover 1104 may be damaged due to very large pressure of the mold resin having entered between component cover 1104 and mounting substrate 1105.

DISCLOSURE OF THE INVENTION

An electronic component package of the present invention comprises: an electronic component in which device elements are mounted inside cavities formed between a component substrate and a component cover covering the component substrate; and a mounting substrate. The electronic component is mounted on the mounting substrate by placing the component cover on the mounting substrate, and the electronic component mounted on the mounting substrate is molded by a resin. The device elements are arranged on the component substrate, and at least one of a ground electrode and a dummy electrode is provided on the surface of the component cover, the surface being placed on the mounting substrate. At least one of the ground electrode and the dummy electrode is provided in a position opposed to at least part of the cavity.

REFERENCE MARKS IN THE DRAWINGS

Figure 1:
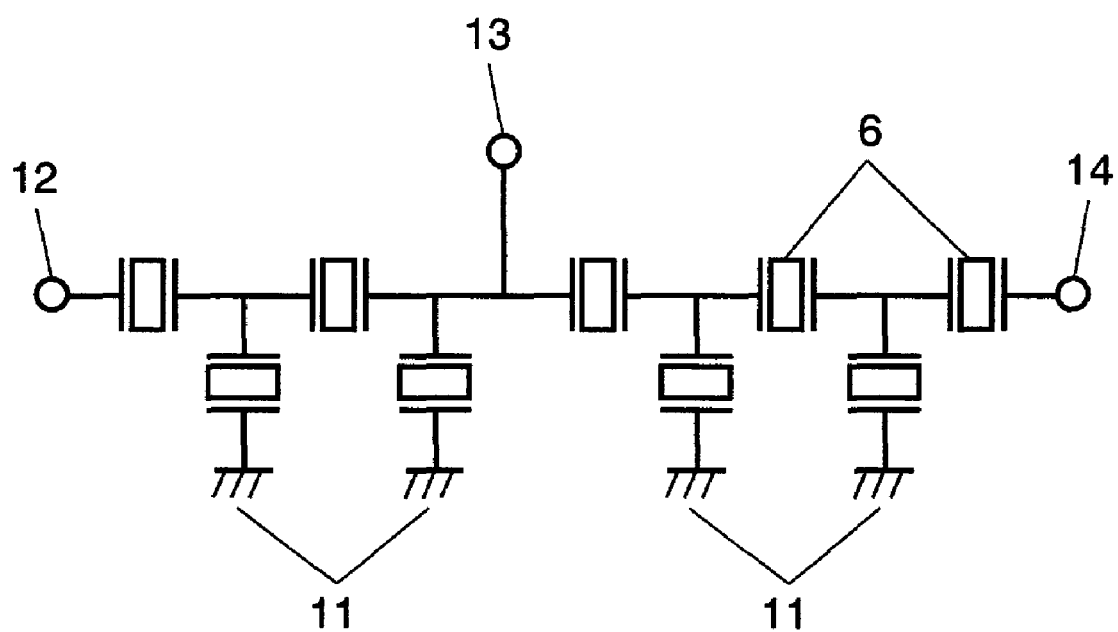
FIG. 1 is a diagram of a surface acoustic wave circuit for an antenna duplexer, provided in embodiments of the present invention.

1 Mounting substrate
2a, 2b, 2c Signal electrode
3 Electronic component (SAW duplexer)
4 Mold resin
5, 37 Compound substrate
6 Device element (IDT electrode)
7 Concave section
8, 32 Component cover 9, 9a Ground electrode
18 Dummy electrode
31 Bonding section
10, 33 Cavity
20 Column
21 Protruding wall
22 Communication passage

PREFERRED EMBODIMENTS FOR CARRYING OUT THE INVENTION

In the following, embodiments of the present invention are described by taking as an example an electronic component package where a surface acoustic wave (hereinafter referred to as SAW) duplexer composed of a SAW circuit for an antenna duplexer is mounted. However, the electronic component in the present invention is not limited to the SAW duplexer.

Embodiment 1

In the following, Embodiment 1 is described with reference to the drawings.

As shown in FIG. 1, the SAW duplexer is composed of reception terminal 12, antenna terminal 13, transmission terminal 14, ground terminal 11, and nine interdigital transducer electrodes (hereinafter referred to as IDT electrodes) 6.

Figure 2A:
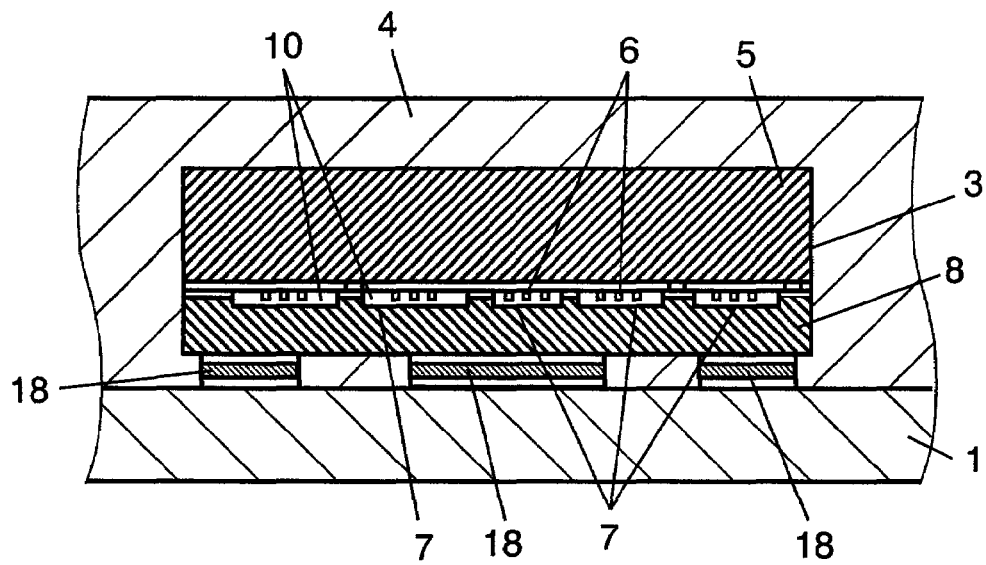
FIG. 2A is a sectional view of an electronic component package in Embodiment 1.

FIG. 2A is a sectional view of an electronic component package where SAW duplexer 3 as an electronic component is mounted. SAW duplexer 3 comprises: component substrate 5 on the under surface of which the SAW circuit shown in FIG. 1 is formed; and component cover 8 which covers the under surface side of component substrate 5 and has concave sections 7 in portions opposed to IDT electrodes 6 formed on the under surface of component substrate 5.

Figure 2B:
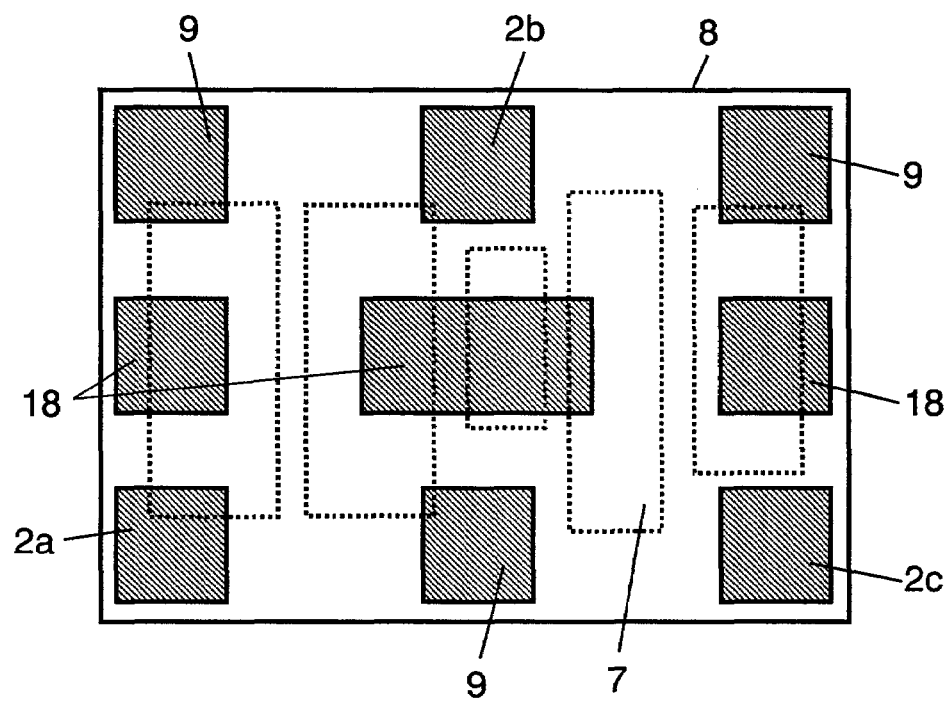
FIG. 2B is a bottom view of a component cover in Embodiment 1.

FIG. 2B is a bottom view of the component cover in Embodiment 1. As shown in FIG. 2B, on the under surface of component cover 8, signal electrode 2a, signal electrode 2b, signal electrode 2c, ground electrodes 9 and dummy electrodes 18 are formed. Signal electrode 2a is connected to reception terminal 12, signal electrode 2b to antenna terminal 13, signal electrode 2c to transmission terminal 14, and ground electrodes 9 to ground terminal 11. SAW duplexer 3 is mounted on mounting substrate 1 with component cover 8 turned downward, and coated by mold resin 4.

A method for manufacturing an electronic component package in Embodiment 1 is described below.

Figure 3:
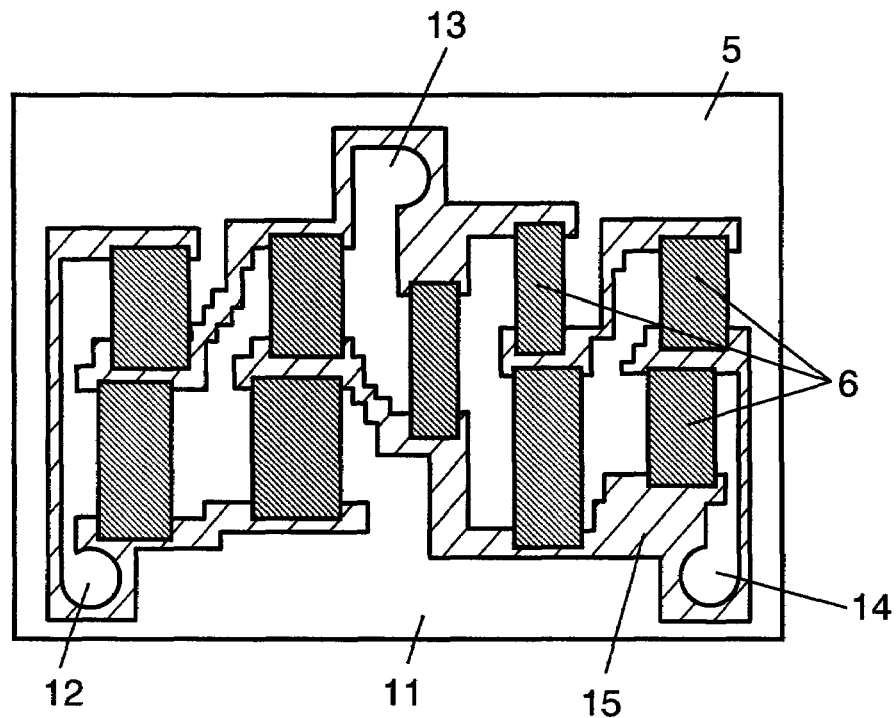
FIG. 3 is a bottom view of a component substrate in Embodiment 1.

FIG. 3 is a bottom view of component substrate 5 in Embodiment 1. As shown in FIG. 3, IDT electrodes 6 and the like are formed on the under surface of component substrate 5. Component substrate 5 is formed of $LiTaO_3$ or $LiNbO_3$, and IDT electrode 6 is formed of a metal material such as aluminum. And from these, ground terminal 11, reception terminal 12, antenna terminal 13, and transmission terminal 14 are formed which are shown in the circuit diagram of SAW duplexer 3 in FIG. 1. It should be noted that, although both ends of IDT electrode 6 are typically provided with reflectors having short-circuit electrodes arranged in parallel, such a configuration is simplified in the description of the present embodiment.

Figure 4:
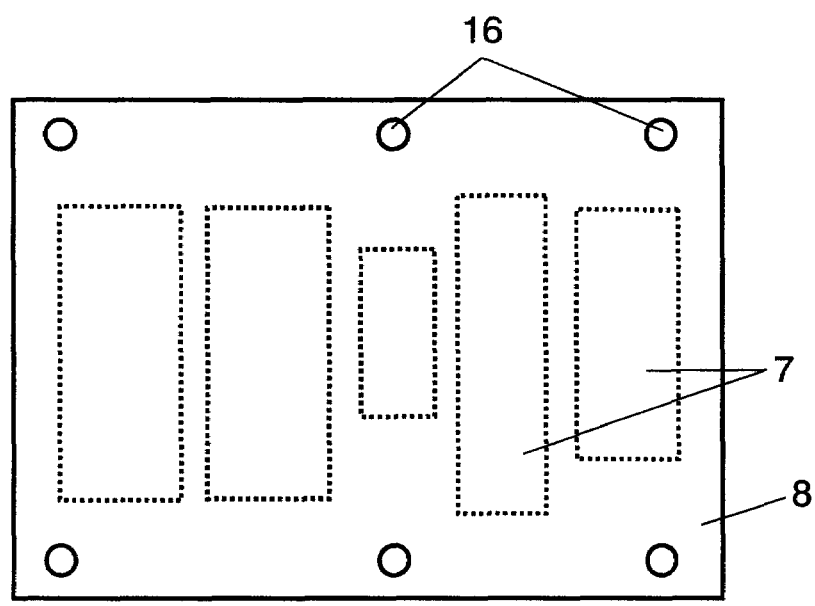
FIG. 4 is a bottom view of the component cover in Embodiment 1, from which electrodes have been omitted.

Meanwhile, the under surface side of component substrate 5 is provided with component cover 8 made of silicon in order to protect IDT electrodes 6 from oxidation and corrosion due to moisture. FIG. 4 is a view of component cover 8 seen from below in a state where signal electrode 2a, signal electrode 2b, signal electrode 2c, ground electrodes 9 and dummy electrodes 18 have been omitted. On the top surface of component cover 8, concave sections 7 are formed in portions opposed to IDT electrodes 6. With concave sections 7 formed, cavities 10 shown in FIG. 2A can be provided between component cover 8 and IDT electrodes 6 so that IDT electrodes 6 can be avoided from coming into contact with component cover 8. It should be noted that in Embodiment 1, all the IDT electrodes are not housed in one cavity as in the conventional example, but cavity 10 is provided for every one or two adjacent IDT electrodes 6. With cavities 10 as thus configured, it is possible to reduce the area of the portion where the thickness of component cover 8 is small. As a result of this, strength against external pressure can be increased. In addition, the smaller the cavity 10 is made, the more the strength against external pressure improves, and hence cavity 10 may be provided for each IDT electrode 6. Further, through holes 16 are formed on component cover 8 for connecting signal electrode 2a, signal electrode 2b, signal electrode 2c and ground electrodes 9 with component substrate 5. Through holes 16 and concave sections 7 can be formed by dry-etching processing.

Figure 5:
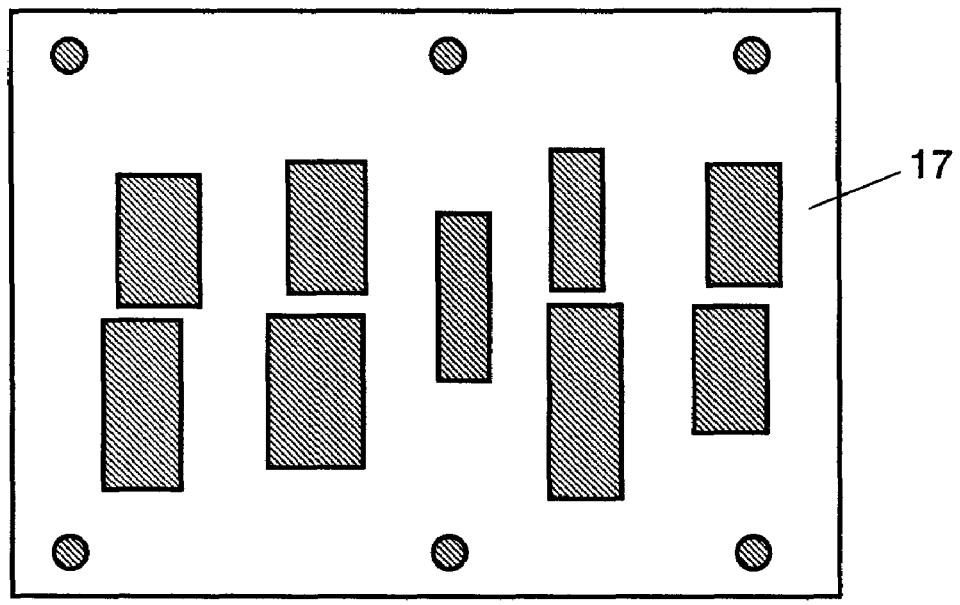
FIG. 5 is a top view of a mask in Embodiment 1.

FIG. 5 is a top view of a mask in Embodiment 1. First, a photosensitive resin is applied on the under surface (surface on which IDT electrodes 6 are mounted) side of component substrate 5 shown in FIG. 3, and mask 17 as shown in FIG. 5 is placed thereon.

Figure 6:
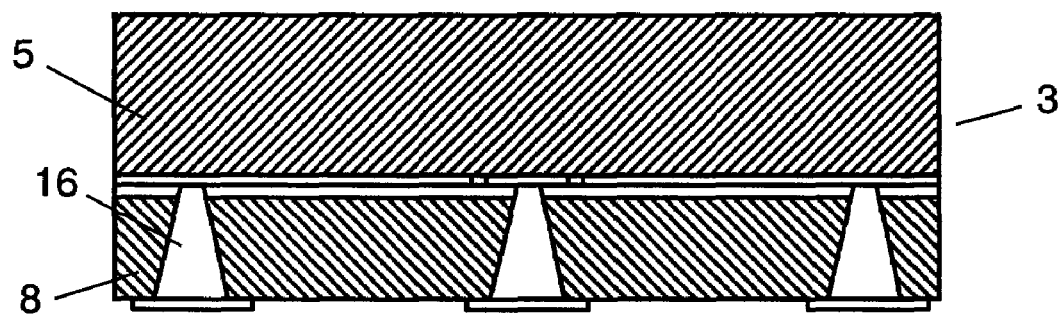
FIG. 6 is a sectional view of an electronic component in Embodiment 1.

Hatched portions on mask 17 in FIG. 5 are portions corresponding to IDT electrodes 6 and through holes 16 and are perforated. Therefore, when exposure and cleaning are performed from above mask 17, the photosensitive resin is hardened to remain only in the hatched portions on mask 17 while the resin does not remain in the white portion. Subsequently, mask 17 is removed, and $SiO_2$ is applied on the whole under surface of component substrate 5, followed by heating. Thereafter, the substrate is soaked into a liquid in which a photosensitive resin dissolves, and thereby the photosensitive resin dissolves and drops off, resulting in that $SiO_2$ remains only in the portion without the photosensitive resin, i.e. the portion other than IDT electrodes 6 and through holes 16. Via this remaining $SiO_2$, component substrate 5 and component cover 8 shown in FIG. 4 are interatomically joined directly to each other at room temperature. FIG. 6 is a sectional view of SAW duplexer 3 as thus produced.

It should be noted that, although the process for bonding component cover 8 performed in vacuum was described in present Embodiment 1, component cover 8 and component substrate 5 can also be bonded by an adhesive agent. In such a case, the bonding can be performed in a nitrogen atmosphere or an oxygen atmosphere. It is to be noted that even when the bonding is performed in the oxygen atmosphere, with cavities 10 in present Embodiment 1 being very small spaces, a trace amount of oxygen is contained in the cavities 10. Therefore, only a thin metal oxide film is formed on the surface of IDT electrode 6, thereby producing the effect of making IDT electrode 6 rather resistant to oxidation.

After bonding of component cover 8 to component substrate 5 as described above, the under surface of component cover 8 is provided with electrodes such as signal electrode 2a, signal electrode 2b, signal electrode 2c and ground electrodes 9, which are then electrically connected to IDT electrodes 6 to obtain SAW duplexer 3. Thereafter, SAW duplexer 3 is mounted on mounting substrate 1. Steps for this mounting are described below.

Signal electrode 2a, signal electrode 2b, signal electrode 2c, ground electrodes 9, and dummy electrodes 18 provided on the under surface of component cover 8 as shown in FIG. 2B are joined with mounting substrate 1 as shown in FIG. 2A. Here, dummy electrode 18 is an electrode which allows no current to pass therethrough and carries out no electrical function. This dummy electrode 18 is also formed in a portion beneath concave section 7. A plurality of dummy electrodes 18 may be formed. As thus described, even when the thickness of component cover 8 is reduced due to concave sections 7, arrangement of dummy electrode 18 in the portion beneath concave section 7 allows prevention of damage caused by external pressure for the below-mentioned reason.

Figure 7:
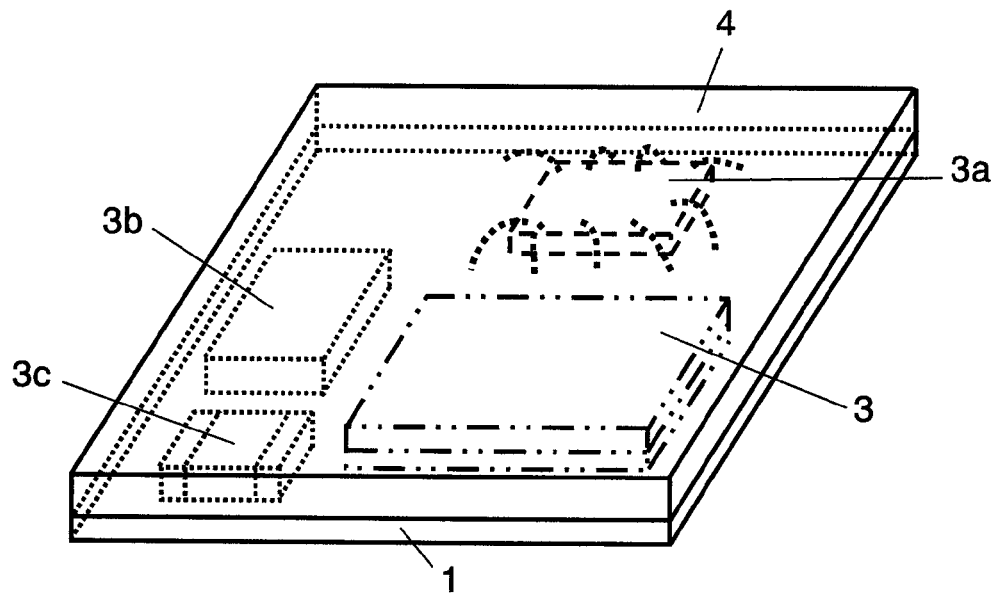
FIG. 7 is an oblique view of an electronic component package when a plurality of electronic components are mounted therein in Embodiment 1.

Finally, a step of coating SAW duplexer 3 by mold resin 4 is described. It should be noted that in description of this step, coating is performed in a state where, besides SAW duplexer 3, electronic component 3a, electronic component 3b and electronic component 3c are mounted on mounting substrate 1 as shown in FIG. 7. However, the same step is performed even when the coating is performed in a state where electronic component 3a, electronic component 3b and electronic component 3c are not present.

First, a compound type electronic component on which a plurality of electronic components 3a, 3b, 3c as well as SAW duplexer 3 are mounted is put into a mold, and subsequently, mold resin 4 having been heated and compressed is injected into this mold, which is then cooled for molding. In present Embodiment 1, an epoxy resin with a filler dispersed therein is used as mold resin 4, and conditions for injecting mold resin 4 are a resin temperature of 175° C. and an injection pressure of 50 to 100 atmospheres.

In filling this mold resin 4, very large pressure is applied to SAW duplexer 3, but the pressure can be dispersed since dummy electrode 18 serves as a column support between mounting substrate 1 and component cover 8. Further, with dummy electrode 18 present, a space between component cover 8 and mounting substrate 1 becomes smaller, making mold resin 4 less prone to enter thereinto. It is thereby possible to prevent pressure applied from below in filling mold resin 4. Therefore, in the package of SAW duplexer 3 of present Embodiment 1, strength against external pressure increases so that damage can be prevented.

It should be noted that, although the portion beneath concave section 7 was provided with dummy electrode 18 in present Embodiment 1, this portion may be provided with ground electrode 9 in place of dummy electrode 18. Further, in the case of using dummy electrode 18, a plurality of dummy electrodes 18 may be used.

Embodiment 2

In the following, Embodiment 2 according to the present invention is described.

Figure 8:
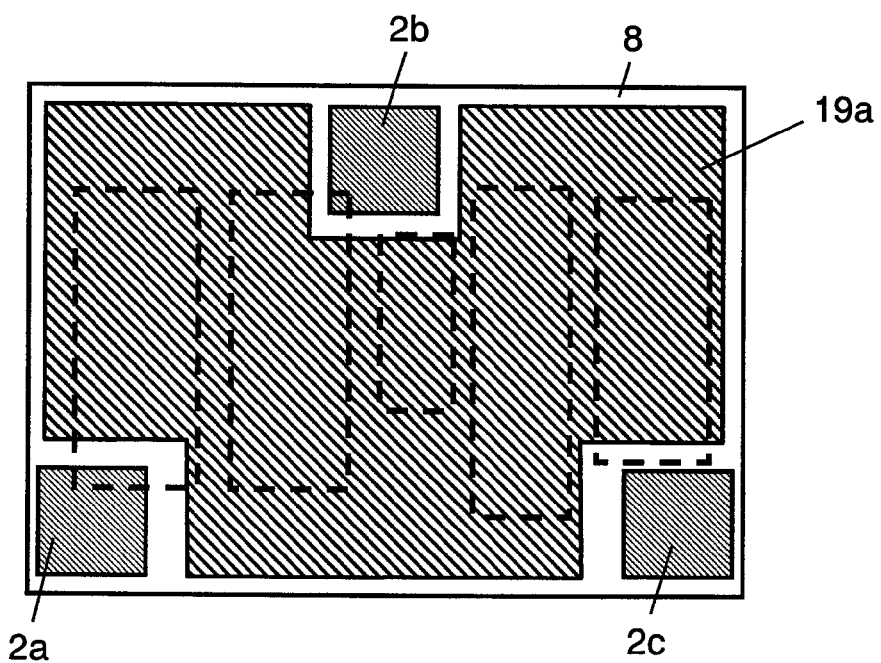
FIG. 8 is a bottom view of a component cover in Embodiment 2.

Embodiment 2 is different from Embodiment 1 in an electrode formed on the under surface of component cover 8. Except for that, Embodiment 2 is the same as Embodiment 1, and descriptions of the same configurations are omitted. FIG. 8 shows electrodes formed on the under surface of component cover 8 in Embodiment 2. As shown in FIG. 8, signal electrode 2a, signal electrode 2b and signal electrode 2c are formed in the same manner as in Embodiment 1, and a ground electrode 19a is formed over the surface except for signal electrode 2a, signal electrode 2b and signal electrode 2c. With this configuration, since an area of contact between ground electrode 19a and mounting substrate 1 is wide, external pressure can be effectively dispersed so as to prevent damage of SAW duplexer 3. Further, with ground electrode 19a present, an amount of mold resin 4 entering between component cover 8 and mounting substrate 1 can be reduced so as to suppress pressure applied from the bottom of component cover 8. Moreover, since the use of such ground electrode 19a makes the area coating SAW duplexer 3 large as compared with the case of the ground electrode in Embodiment 1, it is possible by such a shield effect to improve a frequency characteristic of SAW duplexer 3.

Embodiment 3

Figure 9:
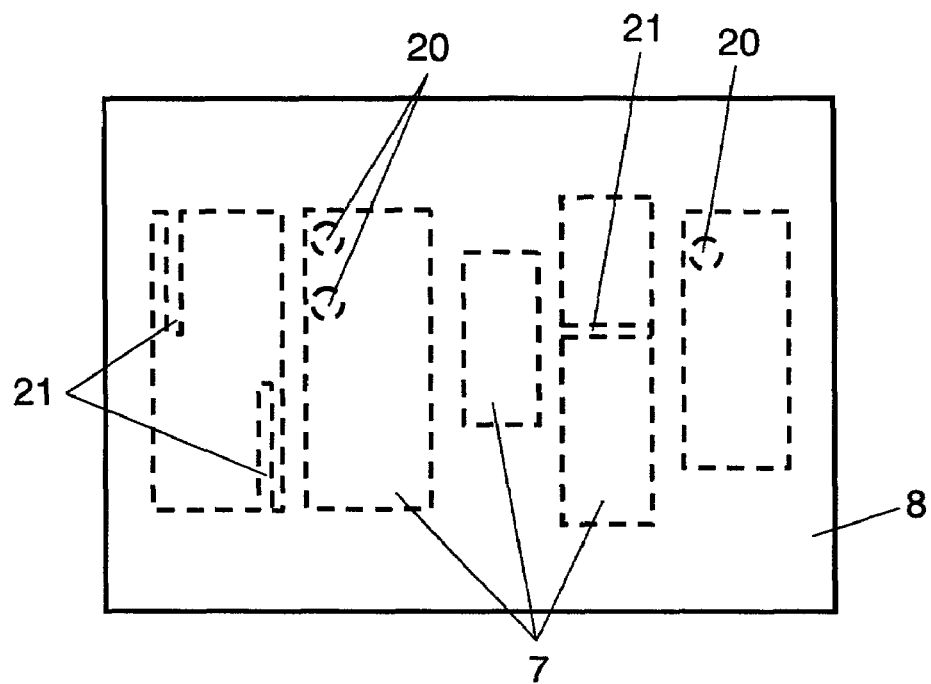
FIG. 9 is a bottom view of a component cover in Embodiment 3, from which electrodes have been omitted.
Figure 10:
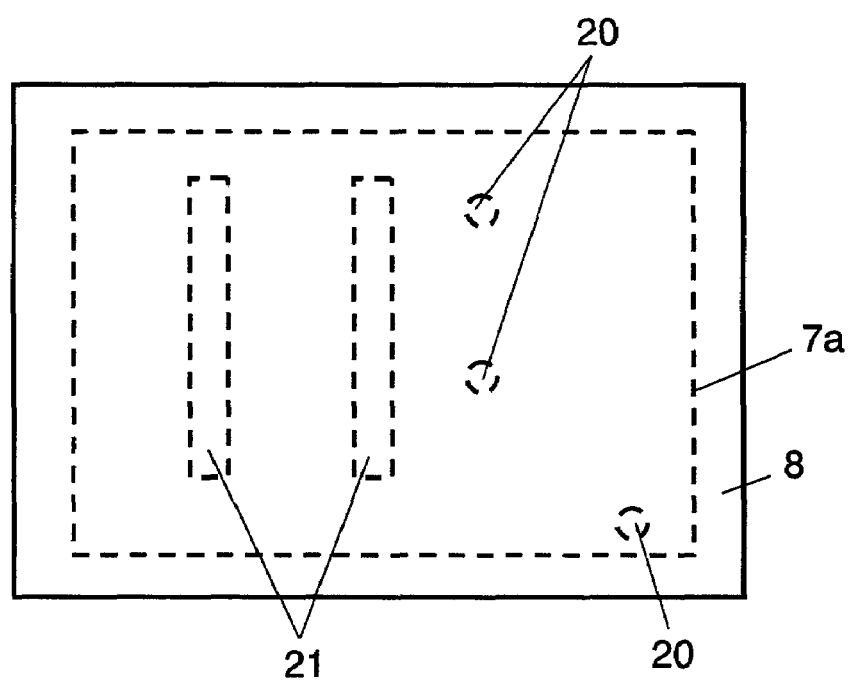
FIG. 10 is a bottom view of a component cover in Embodiment 3, from which electrodes have been omitted.

In the following, Embodiment 3 is described with reference to FIGS. 9 and 10. Embodiment 3 is different from Embodiment 1 in that concave section 7 of component cover 8 is provided with column 20 and protruding wall 21 toward component substrate 5. Column 20 and protruding wall 21 are provided so as not to overlap with IDT electrodes 6. Further, a plurality of concave sections 7 may be provided as shown in FIG. 9, or a plurality of concave sections 7 may be taken together as concave section 7a as shown in FIG. 10. Moreover, column 20 and protruding wall 21 may be formed by dry-etching processing. Since the configurations except for component cover 8 are the same as those of Embodiment 1, descriptions thereof are omitted.

With column 20 and protruding wall 21 provided in such a manner, it is possible to disperse pressure applied to concave section 7 or concave section 7a, so as to prevent damage to SAW duplexer 3.

It should be noted that either/both column 20 or/and protruding wall 21 may be used. Further, using a plurality of columns 20 and protruding walls 21 can lead to an increase in strength of the electronic component package.

Embodiment 4

In the following, Embodiment 4 according to the present invention is described with reference to FIG. 11.

Figure 11:
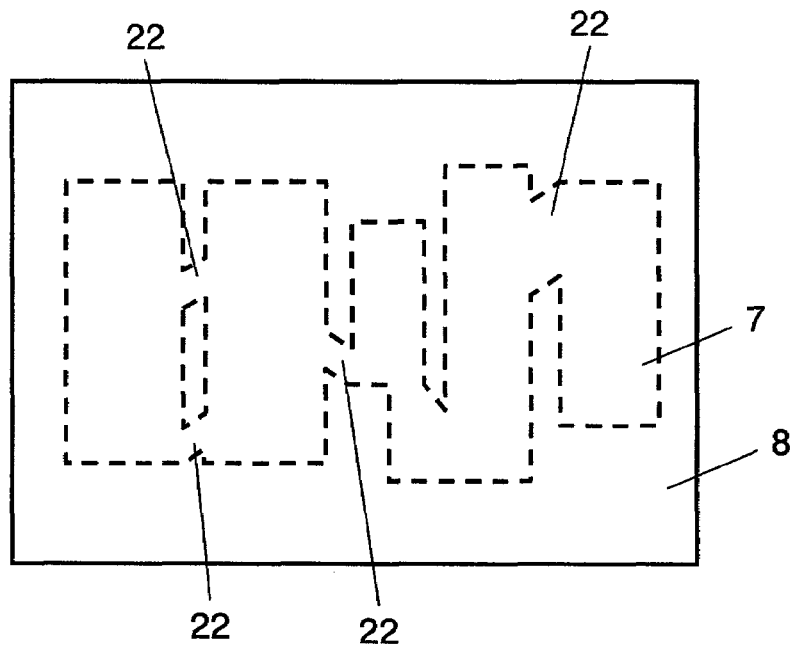
FIG. 11 is a bottom view of a component cover in Embodiment 4, from which electrodes have been omitted.

Embodiment 4 is different from Embodiment 1 in that communication passage 22 is provided among a plurality of concave sections 7 provided on component cover 8, as shown in FIG. 11. It is to be noted that, since the configurations except for formation of communication passage 22 are the same as those of Embodiment 1, descriptions thereof are omitted.

As thus described, the cavities are connected through communication passage 22. Thereby, pressure applied from the outside to part of concave sections 7 can be dispersed to other concave sections 7 through communication passage 22, resulting in producing the effect of significantly improving the strength of the electronic component package against external pressure.

In addition, communication passage 22 can be formed by performing dry-etching processing on component cover 8 as shown in FIG. 11, but it may also be formed only by providing groove 15 on the under surface of component substrate 5 as shown in FIG. 3.

Embodiment 5

In the following, Embodiment 5 is described with reference to the drawings.

Figure 12:
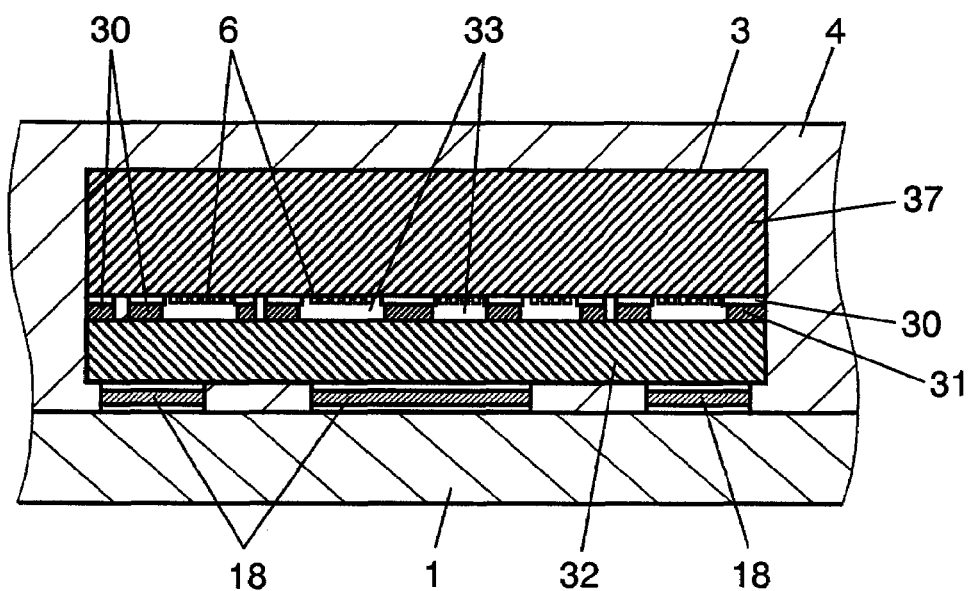
FIG. 12 is a sectional view of a package of a SAW duplexer in Embodiment 5.

FIG. 12 is a sectional view of an electronic component package in Embodiment 5 where SAW duplexer 3 is mounted.

SAW duplexer 3 is composed of: component substrate 37 on the under surface of which the SAW circuit shown in FIG. 1 is formed; and component cover 32 bonded via bonding section 31 on internal ground electrodes 30 formed on the under surface of component substrate 37. Cavities 33 surrounded by bonding section 31 are formed between component cover 32 and IDT electrodes 6 formed on the under surface of component substrate 37. It is to be noted that bonding section 31 is formed by joining first bonding section 31a provided on component substrate 37 side (see FIGS. 14D through 14F) and second bonding section 31b provided on component cover 32 side (FIG. 15C through 15F)

Figure 16:
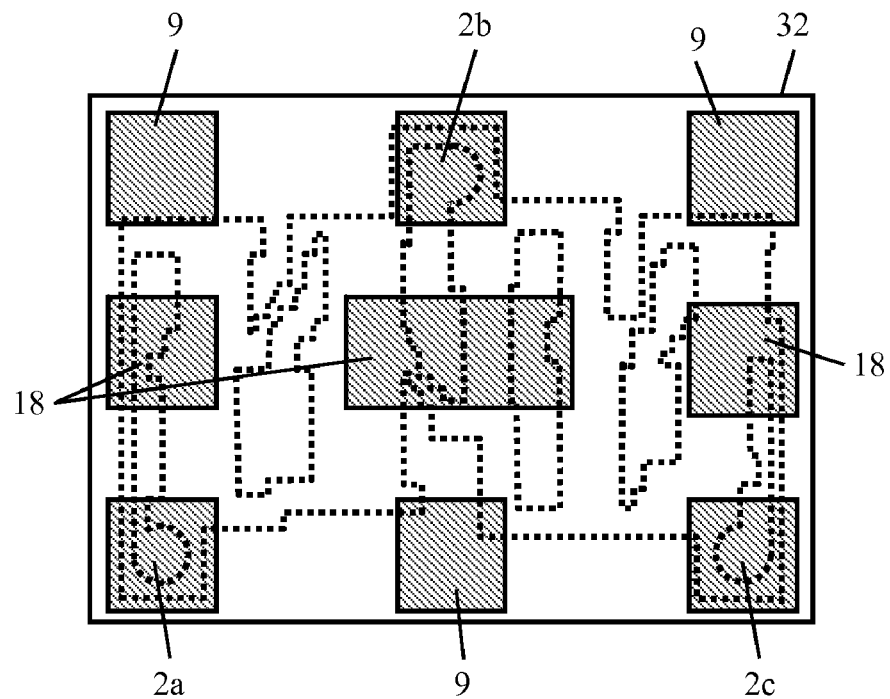
FIG. 16 is a bottom view of the component cover in Embodiment 5.
Figure 17:
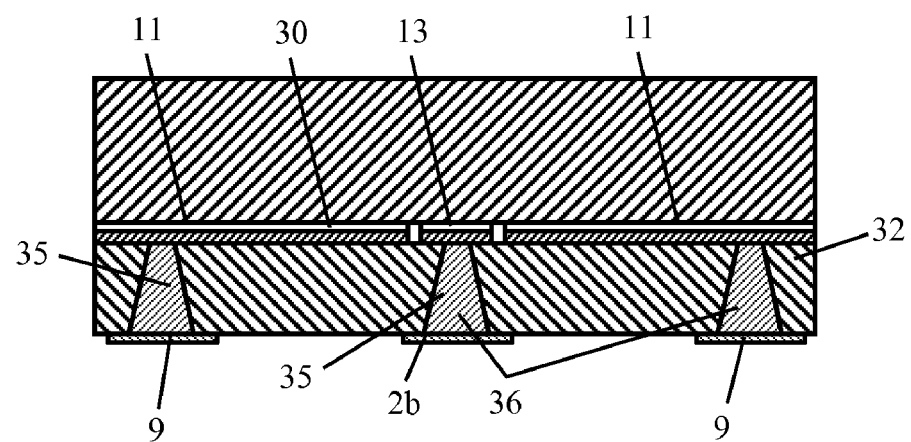
FIG. 17 is a sectional view of a SAW duplexer in Embodiment 5.

FIG. 17 is a sectional view of the electronic component. As shown in FIG. 17, on the under surface of component cover 32, signal electrode 2a (not shown in FIG. 17; see FIG. 16), signal electrode 2b, signal electrode 2c (not shown in FIG. 17; see FIG. 16), ground electrodes 9, and dummy electrodes 18 (not shown in FIG. 17; see FIG. 16) are formed. Signal electrode 2a is connected to reception terminal 12, signal electrode 2b to antenna terminal 13, signal electrode 2c to transmission terminal 14, and ground electrodes 9 to ground terminal 11. SAW duplexer 3 is mounted on mounting substrate 1 with component cover 32 turned downward, and coated by mold resin 4.

In the present embodiment, $LiTaO_3$ is used as a material for component substrate 37, aluminum as a material for IDT electrode 6, and silicon as a material for component cover 32. $LiNbO_3$ can also be used as a material for component substrate 37, and a metal other than aluminum can also be used as a material for IDT electrode 6. As a material for component cover 32, glass, an epoxy resin or the like can also be used.

In the following described is a method for manufacturing an electronic component package in the present embodiment.

Figure 13:
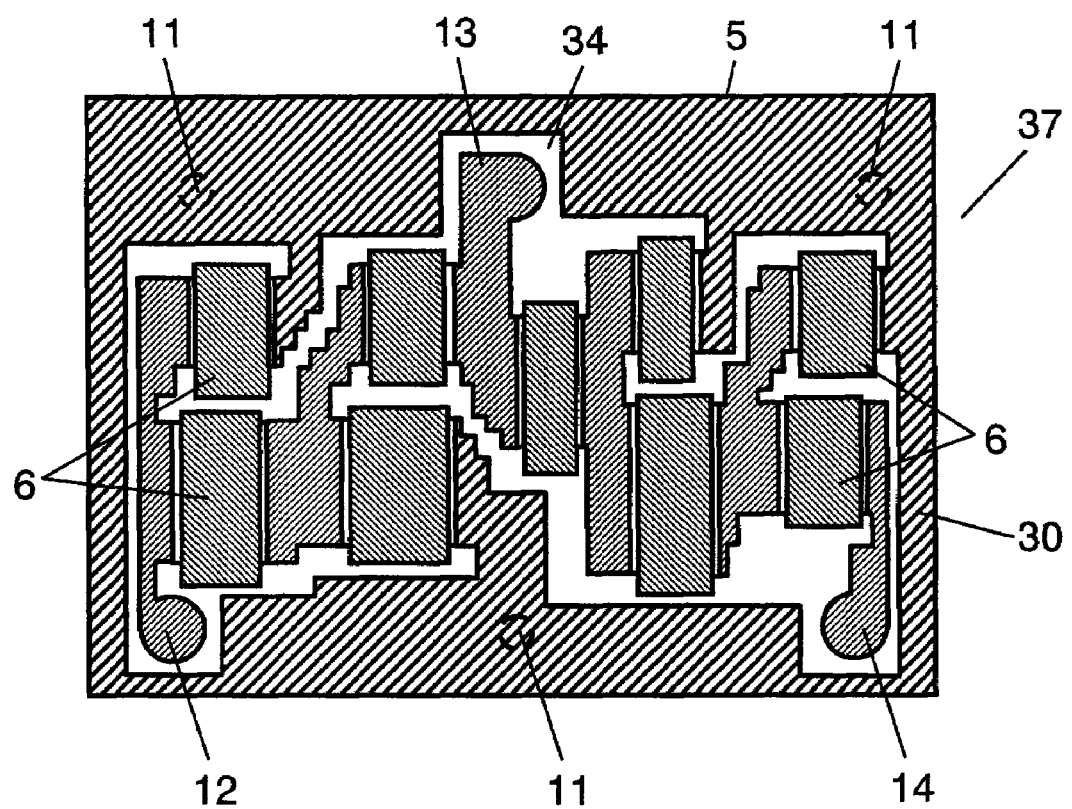
FIG. 13 is a bottom view of a component substrate in Embodiment 5.

FIG. 13 is a bottom view of the component substrate in the present embodiment. First, as shown in FIG. 13, aluminum is sputtered by vapor deposition over the under surface of component substrate 37. Thereafter, groove 34 is provided by dry-etching processing to form IDT electrodes 6 and internal ground electrode 30 as well as reception terminal 12, antenna terminal 13, transmission terminal 14 and ground terminal 11 as extraction electrodes. It should be noted that, although both ends of IDT electrode 6 are typically provided with reflectors having short-circuit electrodes arranged in parallel, such a configuration is simplified in description of the present embodiment. FIGS. 14A to 14F are sectional views showing the method for producing the component substrate in Embodiment 5.

Figure 14A:
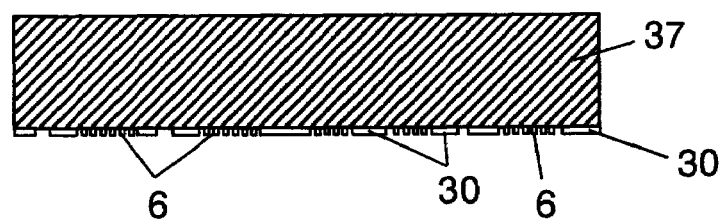
FIG. 14A is a view showing a method for producing a component substrate in Embodiment 5.
Figure 14B:
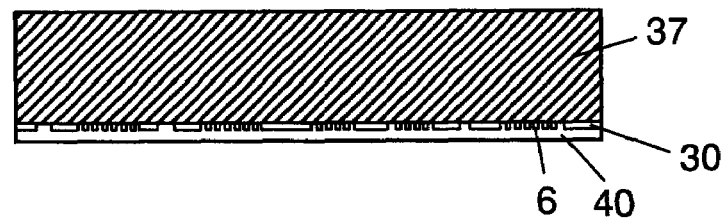
FIG. 14B is a view showing a method for producing the component substrate in Embodiment 5.
Figure 14C:
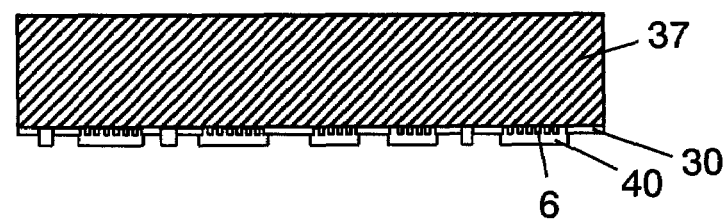
FIG. 14C is a view showing a method for producing the component substrate in Embodiment 5.
Figure 14D:
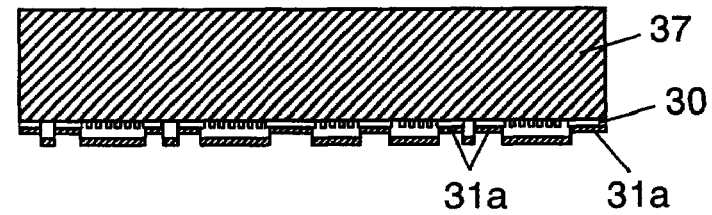
FIG. 14D is a view showing a method for producing the component substrate in Embodiment 5.
Figure 14E:
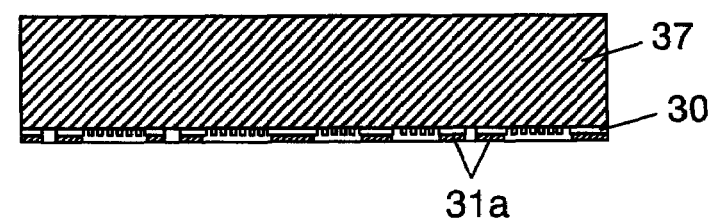
FIG. 14E is a view showing a method for producing the component substrate in Embodiment 5.

As shown in FIG. 14B, resist 40 is applied on the whole under surface of component substrate 37 shown in FIG. 14A, and patterned as shown in FIG. 14C such that the extraction electrodes (these are reception terminal 12, antenna terminal 13, transmission terminal 14, and ground terminal 11, but not shown in FIG. 14C; see FIG. 13) and internal ground electrode 30 (not shown in FIG. 14C; see FIG. 13) are partially visible. Such patterning is aimed at preventing aluminum from being vapor-deposited to the verge of IDT electrodes 6 so as to sufficiently secure vibration spaces for IDT electrodes 6. As shown in FIG. 14D, aluminum is vapor-deposited on the top surface of the patterned resist, and first bonding section 31a is provided on the under surfaces of the extraction electrodes and internal ground electrode 30. Thereafter, as shown in FIG. 14E, the under surface side is polished to be leveled to the height of first bonding section 31a. At this time, since the surface after vapor-deposition has large unevenness, it is preferable that the under surface of first bonding section 31a be polished by a small amount to make the surface (under surface) smooth. This is aimed at enhancing adhesiveness to component cover 32.

Figure 14F:
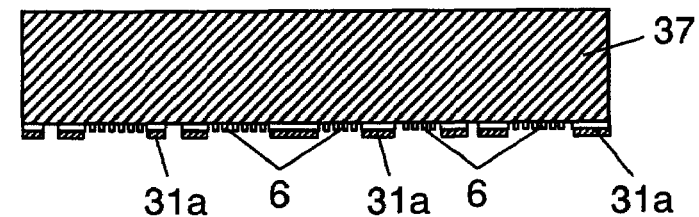
FIG. 14F is a view showing a method for producing the component substrate in Embodiment 5.

Next, component substrate 37 is soaked into an alkaline solution or the like, and when the resist is dissolved, first bonding section 31a is formed so as to be slightly higher than IDT electrodes 6, as shown in FIG. 14F.

On the other hand, as shown in FIG. 12, in order to protect IDT electrodes 6 from oxidation and corrosion due to moisture, the under surface side of component substrate 37 is provided with silicon-made component cover 32. A method for producing component cover 32 is described below with reference to FIG. 15.

Figure 15A:
FIG. 15A is a view showing a method for producing a component cover in Embodiment 5.
Figure 15B:
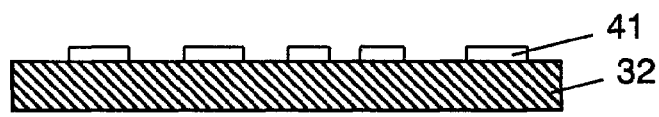
FIG. 15B is a view showing a method for producing the component cover in Embodiment 5.
Figure 15C:
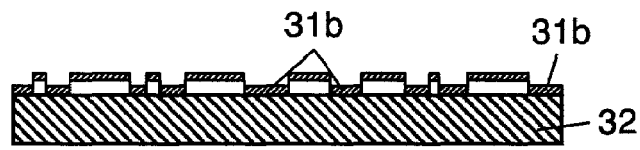
FIG. 15C is a view showing a method for producing the component cover in Embodiment 5.

First, resist 41 is applied on the whole top surface of component cover 32 as shown in FIG. 15A and then patterned as shown in FIG. 15B such that the resist remains in a portion beneath IDT electrodes 6 (portion surrounded by dotted lines in FIG. 16). Subsequently, as shown in FIG. 15C, aluminum is vapor-deposited over the top surface of component cover 32 to form second bonding section 31b.

Figure 15D:
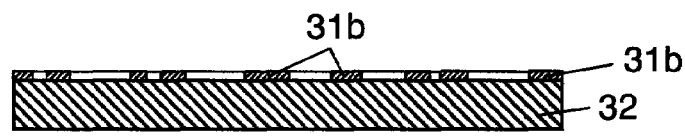
FIG. 15D is a view showing a method for producing the component cover in Embodiment 5.
Figure 15E:
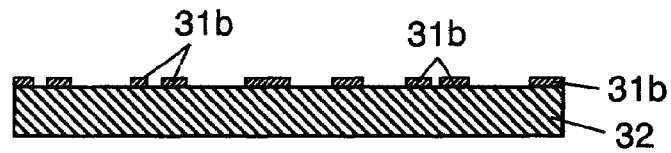
FIG. 15E is a view showing a method for producing the component cover in Embodiment 5.

Next, as shown in FIG. 15D, the top surface of component cover 32 is polished to be leveled to the height of second bonding section 31b. At this time, as in the case of first bonding section 31a, it is preferable that the top surface of second bonding section 31b be also polished by a small amount to make the surface (top surface) smooth. Thereafter, component cover 32 is soaked into an alkali solution or the like, and the resist is then dissolved to complete component cover 32 as shown in FIG. 15E.

Next, a method for joining component cover 32 and component substrate 37 is described below.

Figure 15F:
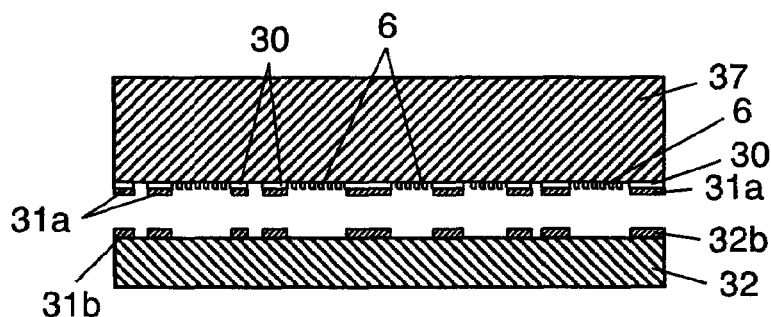
FIG. 15F is a view showing a method for producing the component cover in Embodiment 5.

First, as shown in FIG. 15F, first bonding section 31a provided beneath component substrate 37 and second bonding section 31b provided on the top surface of component cover 32 are positioned so as to be joined to each other. Next, the respective joint surfaces of first bonding section 31a and second bonding section 31b are subjected to plasma processing and then washed. Subsequently, pressure is lightly applied while being heated to 200° C., so that first bonding section 31a and second bonding section 31b are interatomically joined directly to each other to form bonding section 31.

In the present embodiment, cavities 33 are formed between component cover 32 and IDT electrodes 6 by bonding section 31. Although cavities 33 are surrounded by bonding section 31 at intervals of one or two IDT electrodes 6, as shown in the dotted line portion of FIG. 16, cavities 33 are not completely divided and sectioned, but partially connected in the portion of groove 34 provided on the under surface of component substrate 37 shown in FIG. 13.

Next, as shown in FIG. 17, in component cover 32, through holes 35 are formed by dry-etching processing for connecting the extraction electrodes (reception terminal 12, antenna terminal 13, transmission terminal 14 and ground terminal 11 in FIG. 13) with signal electrode 2a, signal electrode 2b, signal electrode 2c and ground electrodes 9. Further, through holes 35 are formed by dry-etching processing for connecting internal ground electrode 30 with ground electrodes 9. Thereafter, Ti, Ni and Au are sequentially vapor-deposited inside through holes 35, and solder is printed inside the vapor-deposition film for filling, to form external terminal connecting sections 36.

Figure 15G:
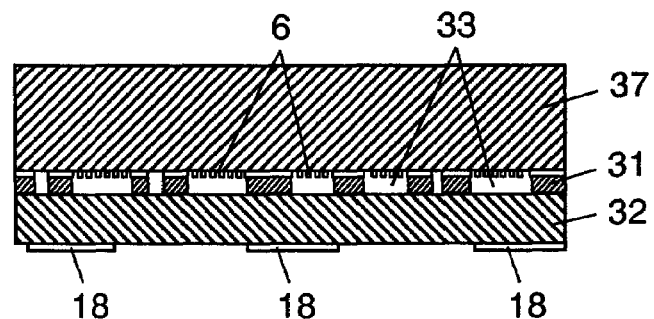
FIG. 15G is a view showing a method for producing the component cover in Embodiment 5.

Subsequently, as shown in FIG. 16, signal electrode 2a, signal electrode 2b, signal electrode 2c, ground electrodes 9 and dummy electrodes 18 are arranged to complete SAW duplexer 3 in FIG. 15G. Here, dummy electrode 18 refers to an electrode which allows no current to pass therethrough and carries out no electrical function. In the present embodiment, as shown in FIG. 16, this dummy electrode 18 is arranged especially in a portion beneath cavity 33. And, a plurality of dummy electrodes 18 are provided. As thus described, arrangement of dummy electrode 18 in the portion beneath cavity 33 allows prevention of damage caused by external pressure for the below-mentioned reason.

Namely, although very large pressure is applied to SAW duplexer 3 when the space between component cover 32 and mounting substrate 1 is filled with mold resin 4 as shown in FIG. 12, since dummy electrode 18 serves as a column support between mounting substrate 1 and component cover 32, the pressure can be dispersed. Further, with dummy electrode 18 present, the space between component cover 32 and mounting substrate 1 is reduced to make mold resin 4 less prone to enter into the space, thereby allowing prevention of pressure applied from below in filling mold resin 4. Therefore, in the package of SAW duplexer 3 in the present embodiment, the strength against external pressure increases, resulting in prevention of damage to the electronic component (SAW duplexer 3).

Further, although cavities 33 are surrounded by bonding section 31 in the present embodiment as described above, cavities 33 are not completely divided, but partially connected in the portion of groove 34 provided on component substrate 37 of FIG. 13. Therefore, the stress applied from the outside to part of cavities 33 can be dispersed over the inside of cavity 33 through groove 34. This results in producing the effect of significantly improving the strength of the electronic component package against external pressure. It is to be noted that groove 34 can be formed into an arbitrary shape in the patterning stage of FIG. 15A, or can be formed by dry-etching processing after aluminum vapor-deposition of FIG. 15E.

In addition, although dummy electrode 18 is provided in the portion beneath cavity 33 in the present embodiment, ground electrode 9 may be provided in this portion in place of dummy electrode 18.

Further, although bonding section 31 is provided only on the under surfaces of the extraction electrodes (reception terminal 12, antenna terminal 13, transmission terminal 14, and ground terminal 11 of FIG. 13) and internal ground electrode 30 in the present embodiment, it may be directly provided on the under surface of component substrate 37.

Moreover, in the present embodiment, component cover 32 is made thinner than component substrate 37 for reduction in height of the electronic component. Hence component cover 32 is particularly fragile, and since the strength of component cover 32 needs improving, the configuration as described above is required.

Embodiment 6

In the following, Embodiment 6 is described with reference to the drawings.

Embodiment 6 is different from Embodiment 5 in an electrode formed on the under surface of the component cover. Except for that, Embodiment 6 is the same as Embodiment 1, and descriptions of the same configurations are omitted.

Figure 18:
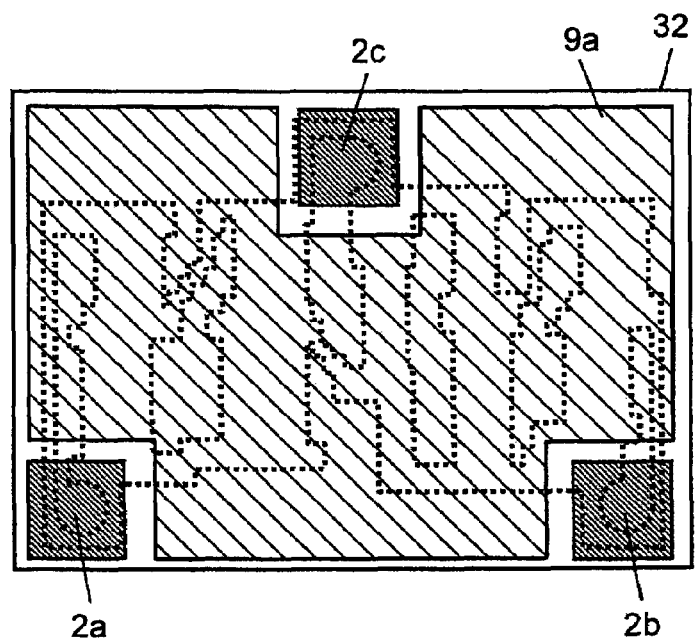
FIG. 18 is a bottom view of a component cover in Embodiment 6.
Figure 19:
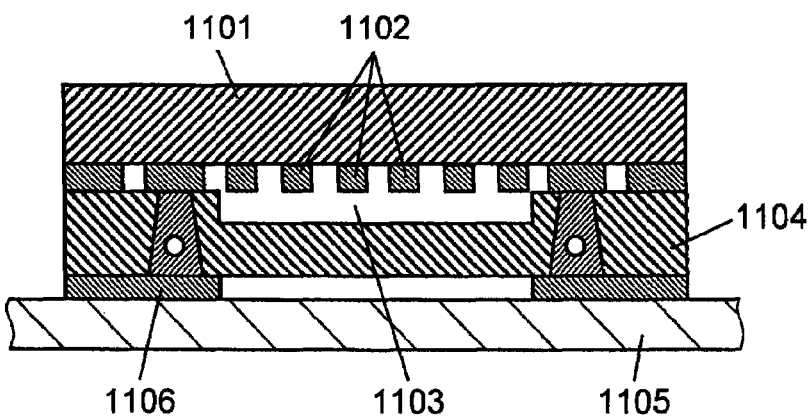
FIG. 19 is a sectional view of a conventional electronic component package.

FIG. 18 shows electrodes formed on the under surface of component cover 32 in Embodiment 6. As shown in FIG. 18, signal electrode 2a, signal electrode 2b, and signal electrode 2c are formed likewise in Embodiment 5, and ground electrode 9a is formed all over the surface except for signal electrode 2a, signal electrode 2b and signal electrode 2c.

With this configuration, since the contact area between ground electrode 9a and mounting substrate 1 is large, it is possible to effectively disperse external pressure, so as to prevent damage to SAW duplexer 3. Further, with ground electrode 9a present, an amount of mold resin 4 entering between component cover 32 and mounting substrate 1 decreases, thereby allowing suppression of pressure applied from below component cover 32. Further, since the use of such ground electrode 9a makes the area coating SAW duplexer 3 large as compared with the case of a conventional external ground electrode, it is possible by such a shield effect to improve a frequency characteristic of SAW duplexer 3.

It is to be noted that, although the SAW duplexer was cited as the electronic component in Embodiments 1 to 6, other than this, the electronic component is applicable to an electronic component where a space is intended to be held between a component substrate and a component cover, such as a SAW filter or a MENS (microelectromechanical system) pressure sensor.

INDUSTRIAL APPLICABILITY

An electronic component package according to the present invention is capable of improving its strength against external pressure to prevent damage to an electronic component, and hence the electronic component package can be applicable to a great degree such as in a transfer molding process under high pressure condition.

The invention claimed is:

1. An electronic component package, comprising:
   a mounting substrate;
   an external electrode arranged on the mounting substrate;
   an electronic component mounted via the external electrode; and
   a mold resin coating the electronic component on the mounting substrate, wherein
   the electronic component has a component substrate, a device element arranged on a first surface of the component substrate, and a component cover which covers the first surface of the component substrate and forms a cavity at a portion of the device element, and
   at least one of a ground electrode and a dummy electrode is provided at a portion facing to the cavity, which is formed at an opposite side surface of the electronic component, of the component cover.

2. The electronic component package according to claim 1, wherein
   a concave section is provided on the surface of the component cover facing the component substrate, and
   the cavity is formed by the concave portion.

3. The electronic component package according to claim 2, wherein
   a plurality of cavities are provided, and
   a plurality of dummy electrodes are provided correspondingly to the plurality of cavities.

4. The electronic component package according to claim 3, wherein a column or a protruding wall is provided at the concave section toward the component substrate.

5. The electronic component package according to claim 4, wherein a plurality of columns are provided.

6. The electronic component package according to claim 2, wherein a signal electrode is further provided on the surface of the component cover, the surface being placed on the mounting substrate.

7. The electronic component package according to claim 6, wherein a column or a protruding wall is provided at the concave section toward the component substrate.

8. The electronic component package according to claim 7, wherein a plurality of columns are provided.

9. The electronic component package according to claim 2, wherein a column or a protruding wall is provided at the concave section toward the component substrate.

10. The electronic component package according to claim 9, wherein a plurality of columns are provided.

11. The electronic component package according to claim 1, wherein
   a bonding section is provided around the device element,
   the component cover covers an under surface side of the component substrate via the bonding section, and
   the cavity is formed between the component substrate and the component cover by the bonding section.

12. The electronic component package according to claim 11, wherein
   a plurality of cavities are provided, and
   a plurality of dummy electrodes are provided correspondingly to the plurality of cavities.

13. The electronic component package according to claim 12, wherein
   the cavities are connected through a communication passage.

14. The electronic component package according to claim 11, wherein a signal electrode is further provided on the surface of the component cover, the surface being placed on the mounting substrate.

15. The electronic component package according to claim 11, wherein
   a plurality of cavities are provided, and
   the cavities are connected through a communication passage.

16. The electronic component package according to claim 14, wherein
   a plurality of cavities are provided, and
   the cavities are connected through a communication passage.

* * * * *